United States Patent

[11] 3,612,960

[72] Inventors Yoshiyuki Takeishi
Tokyo;
Tai Sato, Yokohama-shi; Hisashi Hara, Kamakura-shi; Yoshihiko Okamoto, Yokohama-shi; Hajime Maeda, Tokyo, all of Japan

[21] Appl. No. 866,192
[22] Filed Oct. 14, 1969
[45] Patented Oct. 12, 1971
[73] Assignee Tokyo Shibaura Electric Co., Ltd. Kawasaki-shi, Japan
[32] Priority Oct. 15, 1968, Dec. 3, 1968, Dec. 18, 1968
[33] Japan
[31] 43/74653, 43/88214 and 43/92354

[54] SEMICONDUCTOR DEVICE
5 Claims, 6 Drawing Figs.

[52] U.S. Cl. .................... 317/235, 317/234
[51] Int. Cl. .................... H01l 11/14
[50] Field of Search .................... 317/234 (40.13), 235 (48.5)

[56] References Cited

UNITED STATES PATENTS

| | | | |
|---|---|---|---|
| 3,152,023 | 10/1964 | Minamoto | 317/235 X |
| 3,386,893 | 6/1968 | Harning et al. | 317/235 X |
| 3,476,991 | 11/1969 | Mize et al. | 317/235 |

OTHER REFERENCES

Silicon Semiconductor Technology, a book by Runyar, July 6, 1967, pp. 84–93

*Primary Examiner*—James D. Kallam
*Attorney*—Flynn and Frishauf

ABSTRACT: A semiconductor device in which a semiconductor of diamond-type structure or a compound semiconductor of zinc blende-type structure is used to utilize the flow of a hole current in an intense electric field, and has a construction such that when its crystal face is in [1$\bar{1}$0] zone, and the angle $\theta$ of a normal direction of said specified crystal face with respect to the [110] axis is 0°–30°, 0° exclusive, then the direction of flow of the hole current is parallel to said [1$\bar{1}$0]; if $\theta$=40°–90°, 90° exclusive, the direction of flow of the hole current is in the direction perpendicular to the [1$\bar{1}$0] axis; if said crystal face is in the [001] zone and said normal direction makes an angle $\theta$=0°–45°, both 0° and 45° exclusive, with the [110] axis, the direction of flow of the hole current is in the direction perpendicular to said [001] axis.

FIG. 1
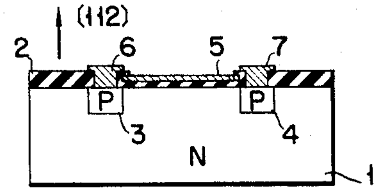
FIG. 2A FIG. 2B
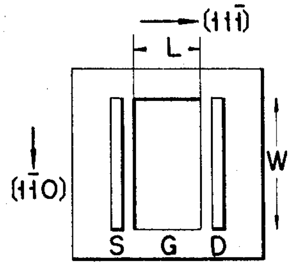
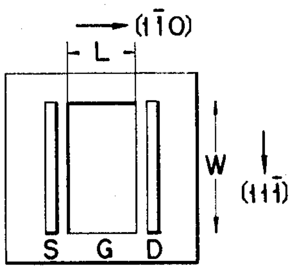
FIG. 3
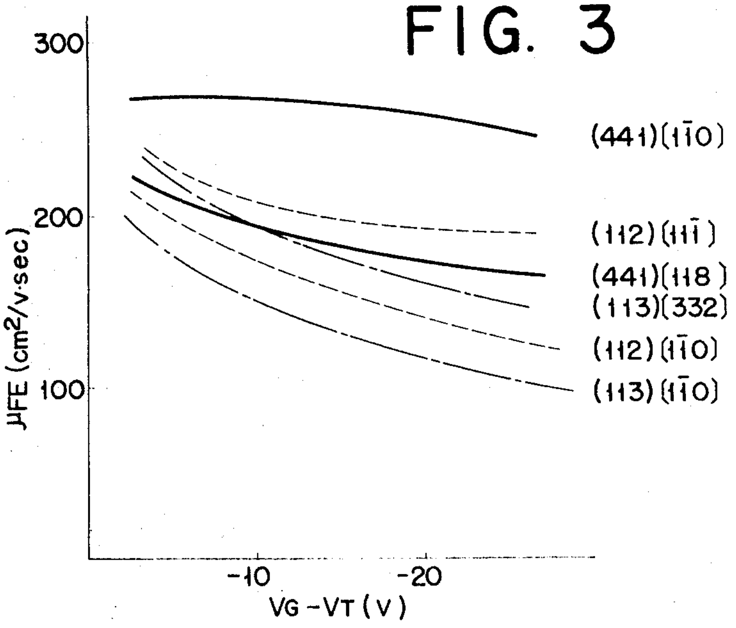

SEMICONDUCTOR DEVICE

BACKGROUND OF THE INVENTION

This invention relates to a semiconductor device, such as an insulated-gate field effect transistor (an MOS field effect transistor), a silicon planar transistor, a planar diode, an MOS Varactor diode or other semiconductor device having an active area on the wafer surface, or on the interface contacting oxide film, and particularly to a semiconductor device having a good hole mobility.

Studies have been made on the crystal face of a semiconductor wafer to be used in a semiconductor device, and crystal faces such as (111), (110) and (001) are known to be useful. It is preferred that the direction in which current flows in the wafer surface is taken to a direction in which carrier mobility is high even in case a particular wafer crystal face is selected according to various factors such as surface conditions, density, noise and design of the semiconductor device. In conventional devices, however, current is allowed to flow in the low-mobility direction only in the absence of sufficient knowledge regarding the direction of flow of current.

SUMMARY OF THE INVENTION

Consequently, it is an object of the present invention to provide a semiconductor device in which current flows in the direction of high carrier mobility, thus improving its characteristics.

In greater details, the present invention provides a semiconductor device in which one semiconductor selected from the group consisting of a semiconductor of diamond-type structure or a compound semiconductor of zincblende structure type is used and the flow of hole current in the intense electric field is utilized, characterized in that if its crystal face is in the $[1\bar{1}0]$ plane or its equivalent plane and the angle $\theta$ of the direction perpendicular to said specified crystal face with respect to the [110] axis or its equivalent crystal axis is 0° to 30°, 0° exclusive, the direction of flow of hole current is in a direction parallel to said $[1\bar{1}0]$ axis or its equivalent crystal axis; and if $\theta$=40°–90°, 90° exclusive, then the direction of flow of the hole current is in a direction perpendicular to the $[1\bar{1}0]$ axis or its equivalent crystal axis; if said crystal face is in the [001] plane zone or its equivalent plane and the angle $\theta$ of its normal direction with respect to the [110] axis or its equivalent crystal axis is 0° to 45°, both 0° and 45° exclusive, the direction of flow of hole current is in a direction perpendicular to said [001] axis or its equivalent crystal axis.

BRIEF EXPLANATION OF THE DRAWINGS

FIG. 1 is a sectional view illustrating a semiconductor device embodying the present invention;

FIGS. 2A and 2B are plan views of the device shown in FIG. 1;

FIGS. 3 and 4 are curve diagrams illustrating the measured values of hole mobility.

DETAILED DESCRIPTION OF THE INVENTION

Figure 4:
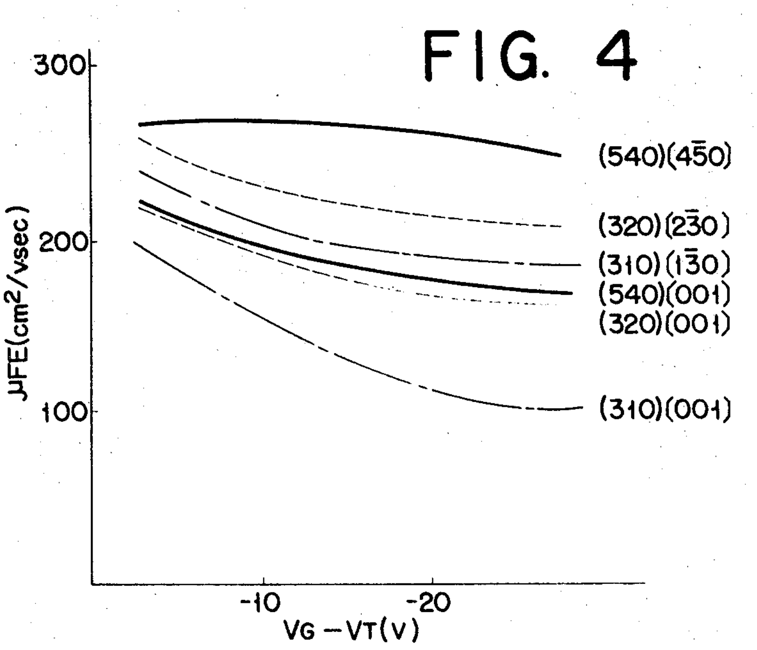

N-type silicon wafers of a specific resistance 1–10 Ωcm., having main faces of (540), (320), (310), (441), (112) and (113) are first prepared. A source S, drain D, and a gate G are formed in each the wafers to fabricate P-channel, metal oxide silicon field-effect transistor of an enchancement type, with a known process.

An example of fabricating such a transistor will be explained with reference to FIG. 1.

A substrate of an N-type silicon wafer 1 is subjected to a wet oxygen gas at temperatures of 960° to 1000° C. to form thereon a film 2 of silicon dioxide having a thickness of 5000 to 6000 A., said oxygen gas having been passed through 80° C. water. A part of an $SiO_2$ film thus formed is removed by photoetching to allow the surface of the wafer 1 to be exposed in the form of two stripes. On the exposed surfaces of the wafer, viz portions from which the $SiO_2$ film has been removed, is deposited $BBr_3$ which is then diffused in the film by being heat-treated at 1050° C. to form a P-type source region 3 and a P-type drain region 4. Thereafter, the remaining $SiO_2$ film left on the surface of the wafer 1 is removed by an HF aqueous solution treatment. The Si wafer 1 is heat-treated in a wetting oxygen atmosphere for 4 minutes at 1145° C. and then in a drying oxygen atmosphere for 10–15 minutes at 1145° C. so as again to form the $SiO_2$ film on the entire surface of the wafer. The film thus deposited is doped with phosphorus to eliminate the effect of faults in the film. The $SiO_2$ film deposited on the source region 3 and drain region 4 is removed. Subsequently, an aluminum layer is vapor deposited on the entire surface at the B-diffused side. The aluminum layer is then removed, excepting that formed on the $SiO_2$ film on said source region 3 and drain region 4 and between these regions by photoetching.

The silicon is sintered at 500° C. for 10 to 20 minutes to form a source electrode 6, drain electrode 7 and a gate electrode 5. The wafer surface right below the gate electrode 5 becomes a channel region, having a width W of, say, 100 μ and a length L of say, 200 μ. The source region 3 and the drain region 4 are so arranged as to enable an electric current to flow in a predetermined direction after the direction of the crystal axis on the wafer crystal face has been determined by X-ray. When the main surface of the wafer 1 has, for example, a (112) crystal face, the surface normal direction is, as shown in FIG. 2A, taken in the direction of a [112] crystal axis, and the main face is disposed in parallel to the intrinsic crystal face with ±8° tolerances. The source S and drain D are arranged such that the direction of flow of a hole current passing therebetween is either that of the $[11\bar{1}]$ (or $[\bar{1}\bar{1}1]$) crystal axis (FIG. 2A) or that of $[1\bar{1}0]$ (or $[\bar{1}10]$) crystal axis (FIG. 2B), whereby the direction of current flow can be specified with ±8° tolerances. A voltage $V_{DS}$=−10mv. is impressed at both normal temperatures, 298° K. and 77° K. between source S and drain D, and another voltage $V_G$ between the gate G and source S with the source S and substrate short-circuited, the mutual conductance gm. was measured and the field-effect mobility μFE is obtained from the relationship:

$$gm. = (W/L)\cdot(\epsilon oX/d)\cdot\mu FE\cdot V_{DS}$$

where:

$\epsilon oX$ = the permittivity of the oxide film, $d$ = the thickness of the oxide film, $L$ = the length of the channel, and $W$ = the width of the channel.

FIGS. 3 and 4 show the results of experiments measured at the normal temperature. In the FIGS., $V_G$ designates the gate voltage, $V_T$ the threshold voltage of hole current at the initial flow, (1, $m$,$n$) the crystal face index of the wafer surface, and [$l'$, $m'$, $n'$] the directions of the current flowing between the source S and drain D with respect to the crystal axis. It has been found, as shown, that if the crystal face is (441), then μFE [110]>μFE [118]; if it is (112) then
μFE $[1\bar{1}0]$<μFE $[11\bar{1}]$; if it is (113), then
μFE $[1\bar{1}0]$<μFE $[33\bar{2}]$; if it is (540), then
μFE $[4\bar{5}0]$>μFE [001]; if it is (320), then
μFE $[2\bar{3}0]$>μFE [001]; and if it is (310), then
μFE $[1\bar{3}0]$>μFE [001].

It has also been found that the results obtained at normal temperature can equally apply to those measured at 77° K.

Although there is an error of ±8° between the designations of the wafer surface orientation and the direction of current flow, the same results have been obtained even when the angle is purposely shifted with ±5° tolerances.

Figure 5:
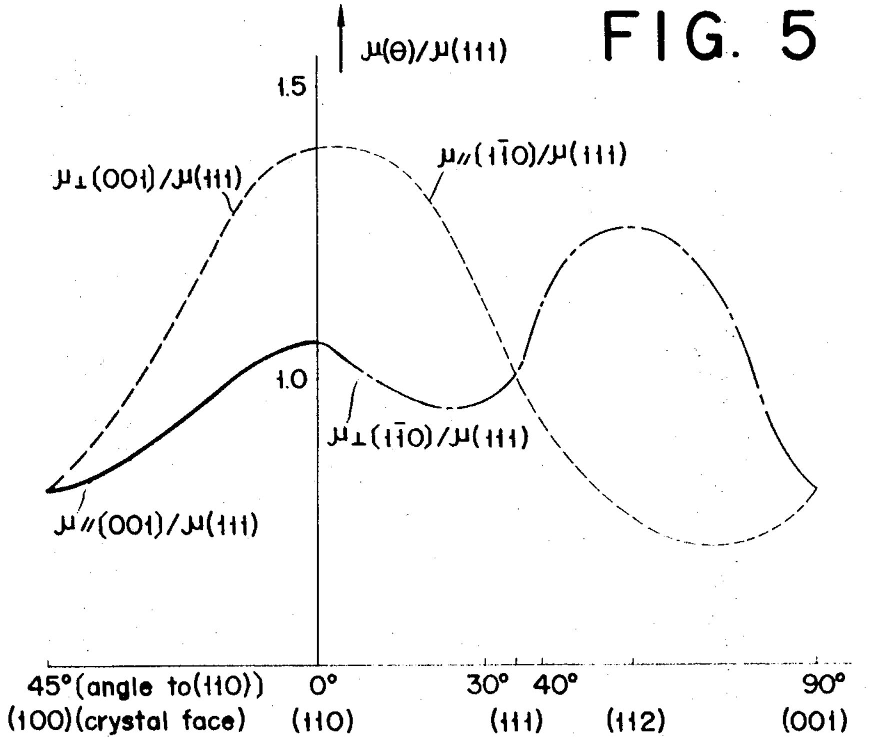
FIG. 5 is a curve diagram showing the calculated values of hole mobility.

FIG. 5 shows the results obtained from a theoretical calculation of the carrier mobility in two main surface directions in case the surface normal direction of the wafer crystal face is normal to $[1\bar{1}0]$ crystal axis. Here, $\theta$ denotes the angle formed by the surface normal direction of the wafer crystal face and the [110] crystal axis, $\mu_{\parallel}[1\bar{1}0]$ a mobility in the case of a current flow parallel to $[1\bar{1}0]$ crystal axis, $\mu_{\perp}[1\bar{1}0]$ a mobility μ in the case of a current flow normal to [1$\bar{1}$0] crystal axis, $\mu_{\perp}$[001] a mobility $\mu$ in the case of a current flow parallel to [001] crystal axis, and $\mu$ [001] indicates a mobility $\mu$ in the case of a current flow normal to [001] crystal axis.

When the wafer surface is a (111) crystal face, the surface mobility is isotropic so that it is simply represented as $\mu$(111). In the Figure, $\mu_{11}$[1$\bar{1}$0]/$\mu$(111), $\mu_{\perp}$[1$\bar{1}$0]/$\mu$(111), $\mu_{\perp}$[001]/$\mu$(111), and $\mu_{11}$[001]/$\mu$(111) are plotted with respect to each value of $\theta$. It has been confirmed from the figure that the plottings qualitatively coincide with the experimental results.

The following relations have been obtained from these results:

a. If $\theta$=0°–30°, then $\mu_{11}$[1$\bar{1}$0]>$\mu$ [1$\bar{1}$0];

b. If $\theta$=40°–90°, then $\mu_{11}$[1$\bar{1}$0]<$\mu_{\perp}$[1$\bar{1}$0];

c. If $\theta$=0°–45°, 45° exclusive, in the direction from (110) to (100), $\mu_{\perp}$[001]>$\mu_{11}$[001].

As seen from the figure, there is a slight change of $\mu$ at an angle between (110) and (001) or at 30°–40° and the value of $\mu$ also is small, so that no marked effect can be obtained. The angle between (110) and (100) or 45° is also excepted for the same reason as described above.

Consequently, the flow of a highly mobile carrier current can be best utilized by selecting the direction of current flow of a metal oxide silicon field-effect transistor with respect to its specified wafer orientation to be (1) parallel to the [1$\bar{1}$0] crystal axis in the case of the wafer surface specified in (a) above; (2) perpendicular to the [1$\bar{1}$0] crystal axis in the case of the wafer surface specified in (b) above; and (3) perpendicular to the [001] crystal axis in the case of the wafer surface specified in (c) above.

It will be clear from FIG. 5 that when the (112) crystal face is employed, the hole mobility is optimum in the above-mentioned range (b); and the wafer can easily be cut and the surface state density is relatively small. Similar advantages can be obtained when a crystal face parallel to the (112) crystal face with ±8° tolerances is used.

According to this invention, similar results can be obtained not only in a silicon semiconductor but also in a similar device in which semiconductors of diamond-type structure for example, germanium, semiconducting diamond, boron nitride, or compound semiconductors of zincblende-type structure for example, gallium arsenide, gallium phosphide, indium arsenide, indium antimonide, indium phosphide, gallium antimonide, are used, insofar as the intensity E of an electric field in the semiconductor interface is large. For example, similar results have been obtained by the use of a semiconductor of diamond-type crystal and a compound semiconductor of zincblende-type crystal under the conditions E>2×10$^4$ v./cm. and E>1×10$^4$ v./cm., respectively, The advantage of the invention, however will not be expected when the intensity E is lower than 1×10$^4$ v./cm.

In the above description, the rectangular gate was taken as an example. It should be understood that the same results can be obtained by the use of a comb-shaped gate with respect to the direction of the main hole current. Since the above phenomena are common to the hole mobility in an intense electric field, similar effects can be produced not only in metal oxide silicon field-effect transistors but also in planar transistors (in case of a PNP junction, it may be applied to hole current flowing in the *n* region), various insulators in place of the oxide, for example, silicon nitride, various types of diodes, metal oxide silicon Varactor diodes, and all semiconductor devices in which operating regions are on interfaces which contact the wafer surface, and oxide film, and the like.

We claim:

1. A semiconductor device comprising a substrate made of one semiconductor selected from the group consisting of a semiconductor of diamond-type structure and a compound semiconductor of zincblende-type structure, and active areas formed in the surface of said substrate, and utilizing the flow of a hole current in an intense electric field formed in said active areas, wherein the direction of flow of hole current is in a crystal face wherein upon the crystal face being in a [110] plane or its equivalent plane, with an angle $\theta$ defined by the normal direction of said crystal face and a 110 axis or crystal axis equivalent thereto being between 0° to 30°, 0° exclusive, the direction of flow of the hole current is parallel to said [110] axis or to a crystal axis equivalent thereto, and with said angle $\theta$ being from 40° to less than 90°, the direction of flow of the hole current is perpendicular to the [110] axis or to a crystal axis equivalent thereto, and wherein upon the crystal face being in a [001] plane or in a plane equivalent thereto, with said angle $\theta$ being from 0° to less than 45°, 0° exclusive, the direction of flow of the hole current is perpendicular to said [001] axis or a crystal axis equivalent thereto.

2. The semiconductor device as specified in claim 1 in which said direction of flow of hole current shifts from said crystal face with ±8° tolerances.

3. The semiconductor device as specified in claim 1 in which said crystal face is parallel to a (112) crystal face or parallel to the (112) crystal face with ±8° tolerances.

4. The semiconductor device as specified in claim 1 in which the intensity of a high electric field formed within the active area is more than 1×10$^4$ v./cm.

5. The semiconductor device as specified in claim 1 in which said substrate comprises source and drain regions separately formed on the surface of the substrate and each having a conductivity opposite to that of the substrate, an insulating film formed on the surface of said substrate between said source and drain regions, a gate electrode formed on said insulating film, and a channel formed between the source and drain regions at that portion which is right below said insulating film, source region, drain region, and said channel constituting said active areas, and said hole current flowing through said channel.